MICROWAVE AMPLIFIER OR OSCILLATOR EMPLOYING NEGATIVE RESISTANCE DEVICES MOUNTED ACROSS SLOTS IN WAVEPATH WALL

Original Filed March 22, 1962

INVENTOR
S. E. MILLER
BY
Sylvan Sherman
ATTORNEY 3,254,309

MICROWAVE AMPLIFIER OR OSCILLATOR EMPLOYING NEGATIVE RESISTANCE DEVICES MOUNTED ACROSS SLOTS IN WAVEPATH WALL

Stewart E. Miller, Middletown, N.J., assignor to Bell Telephone Laboratories, Incorporated, New York, N.Y., a corporation of New York Continuation of application Ser. No. 181,768, Mar. 22, 1962. This application Dec. 29, 1964, Ser. No. 421,773
4 Claims. (Cl. 330—34)

This is a continuation of application Serial No. 181,768, filed March 22, 1962, now abandoned, and relates to microwave devices, and more specifically to microwave amplifiers and oscillators utilizing negative resistance devices.

In the past few decades the electronics art has undergone a virtual revolution in the field of microwaves. Interest in the microwave field has been further stimulated in recent years by the development of solid state devices such as the tunnel diode and the variable-capacitance, or varactor, diode.

The tunnel diode (sometimes referred to as the Esaki diode) as well as many other two-terminal devices which will be referred to collectively hereinafter as negative resistance diodes, is known to exhibit a region of negative dynamic resistance in its characteristic voltage-current curve. Such devices include the pnpn type diode and certain germanium diodes known in the art. The varactor diode is not, inherently, a negative resistance diode; however, when utilized in certain parametric amplifier structures the varactor diode assumes characteristics of a negative resistance device. See: "The Variable-Capacitance Parametric Amplifier," by E. D. Reed, Bell Laboratories Record, October 1959, pages 373–379.

Accordingly, as used hereinafter, the term "negative resistance device" shall be understood to refer to devices which have an inherent negative resistance and to devices which are capable, under appropriate conditions, of exhibiting a negative resistance.

While other devices can, in general, be used in practicing the present invention, for the purposes of illustration, the tunnel diode will be specifically referred to.

In the past, tunnel diode microwave amplifier structures have taken many forms including diodes mounted within coaxial lines and cavities of varying configurations. Tunnel diodes have also been mounted across strip transmission lines and within hollow waveguides. (See, for example, Hines, M. E., "High-Frequency Negative-Resistance Circuit Principles for Esaki Diode Applications," Bell System Technical Journal, vol. 39, May 1960, pages 477–513; and Burrus, C. A., and Trambarulo, R. F., "A Millimeter-Wave Esaki Diode Amplifier," Proceedings of the Institute of Radio Engineers, vol. 49, June 1961, pages 1075–1076.)

All of these amplifier structures enjoy certain advantages, such as low noise figure, ability to operate at high microwave frequencies and very low power requirements. Along with the advantage of low power requirements for such structures, there is also the disadvantage of low maximum power output.

One method of increasing the output power of a microwave amplifier is simply to place a number of negative resistance diodes in parallel. Such diodes, however, are low impedance devices and the more diodes one places in parallel, the lower the impedance of the combination becomes. Since the diodes are typically matched to a transmission path or energy propagating structure of a much higher impedance, it is seen that such matching means generally become more and more elaborate in order to compensate for the higher degree of mismatching which occurs if paralleled negative resistance diodes are used. This, in turn, leads to undesirable band limiting effects.

One object of the present invention is to increase the power gain of microwave amplifiers using a plurality of negative resistance devices without restricting the bandwidth unduly.

It is another object of the present invention to provide microwave amplifier structures which require no external unilateral circuit elements in order to produce unidirectional energy propagation.

It is a further object of the preesnt invention to simplify means for adjusting the gain and tuning of microwave amplifiers using negative resistance diodes.

The various stated objects are accomplished, in accordance with the principles of the present invention, by utilizing a plurality of slots or irises longitudinally spaced along the length of the outer wall of a signal wave transmission path. The electromagnetic wave energy propagating along the path is coupled to each of the slots in succession. A separate negative resistance device is mounted in each of the slots so that the voltage produced across the slot causes a current to flow through the device. By virtue of the well-known amplifying properties of negative resistance elements, such as the above-mentioned tunnel diode, the propagating wave energy is amplified.

The amplified energy is coupled back to the wave path to propagate therein. If the longitudinal spacing between the centers of adjacent slots is made equal to one-quarter guide wavelength, or an odd multiple thereof, the tendency for the device to reflect a significant portion of the amplified energy is substantially eliminated. The resulting unidirectional amplification is achieved by causing the amplified wave energy to add in-phase in the forward direction and to cancel in the reverse direction.

In order to prevent the slots from radiating and to provide impedance matching means and frequency tuning means, adjustable cavities are mounted behind each of the slots external to the wave path. These cavities also enable the bandwidth of the device to be adjusted in a manner similar to the stagger tuning of wide-band amplifiers.

As another feature of the present invention, means are provided for adjusting the gain of each of the amplifier stages. This adjustment is accomplished, in accordance with the principles of the present invention, by adjusting the position of the slot and nonlinear impedance element with respect to the electric current pattern of the propagating wave in the walls of the signal wave transmission path. In this manner the degree of coupling between the slot, which contains the negative resistance device, and the propagating wave is varied, thereby varying the gain of the amplifier.

The above-mentioned and other features and objects of the invention will become more apparent by reference to the following description taken in conjunction with the accompanying drawings, in which.

Figure 1:
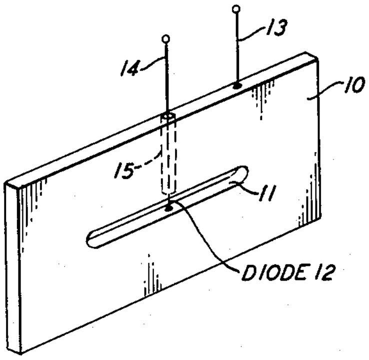
FIG. 1 is a perspective view of a diode mounted in a slot formed in a conducting wafer.

Referring more specifically to the drawings, FIG. 1 shows a wafer 10 of substantially rectangular transverse dimensions. Wafer 10 is constructed of a material, such as copper, having a high conductivity at microwave frequencies. A slot or iris 11 is formed in wafer 10 and a diode 12 mounted between the two longer surfaces thereof so that the high frequency currents flowing across the narrow dimension of the slot flow through the diode. Diode 12 is of a type having a voltage-current characteristic which includes a negative resistance region. The dimensions of slot 11 are determined by the frequency band over which the device is intended to operate. Slot 11 may, of course, have a geometry different from the rectangular geometry illustrated. Its position in wafer 10 and the position of diode 12 within slot 11 can also be varied; however, for the purposes of illustration slot 11 and diode 12 are shown centered in wafer 10.

Bias voltage for diode 12 is applied through lead 13 which is conductively attached to wafer 10 and lead 14 which passes through wafer 10 by means of feed-through bushing 15. Bushing 15 functions as a bypass capacitor and enables the direct-current biasing current to pass through to diode 12 while at the same time acting as a short circuit for currents in the microwave frequency region. A bypass structure suitable for this purpose is disclosed in the copending application of F. A. Braun and R. F. Trambarulo, Serial No. 146,768, filed October 23, 1961.

Figure 2:
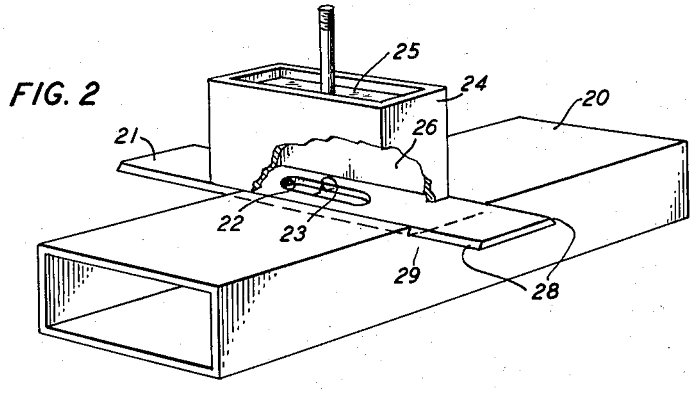
FIG. 2 is a partially broken away perspective view of an embodiment of the present invention which allows the gain of the amplifier to be easily adjusted.

In FIG. 2 there is shown in a perspective view, which is partially broken away, one embodiment of the present invention which allows the coupling between the slot-diode combination and the waveguide to be easily adjusted. In this embodiment the wafer 21 is mounted in one of the wide walls of a rectangular waveguide 20, and is free to move in a transverse direction with respect to the guide axis. Slot 22 is formed in wafer 21 and diode 23 is mounted perpendicular to the broader surfaces of the slot as in FIG. 1. The long dimension of slot 22 is oriented so that it is perpendicular to the longitudinal axis of the guide. This orientation places diode 23 in a position parallel to the wall currents in the center of one of the wide walls of guide 20. The currents in the wide walls are, in turn, substantially parallel to the guide axis for energy propagating in the dominant $TE_{10}$ wave mode.

Mechanical and electrical connection between waveguide 20 and wafer 21 can be obtained by a method similar to that disclosed in United States Patent No. 2,930,995, issued to G. E. Korb on March 29, 1960. The transversely extending edges 28 of wafer 21 are beveled at an angle and the edges 29 of the aperture in guide 20 are likewise beveled at the same angle. Wafer 21 can then be slideably inserted in the aperture.

When engaged as shown in the drawing, wafer 21 is held in intimate contact with guide 20 forming a continuous and substantially smooth conducting surface within the guide. In addition, a slideable yet mechanically strong bond is established between guide 20 and wafer 21.

A second rectangular waveguide section 24 abuts against wafer 21 at a right angle and is mechanically and electrically connected thereto. Guide 24 is conductively shorted by an adjustable piston 25. In this manner a cavity 26 is formed contiguous to, and electromechanically coupled to slot 22. Diode 23 is supplied with direct-current biasing power from a biasing source (not shown) which can take the form of a battery or other source of low voltage direct current. The biasing source serves to bias the diode in the negative resistance region of its characteristic curve. If the negative resistance region were perfectly linear, the bias point would preferably be in the center thereof. In the practical case, however, the bias point can be somewhat different, depending upon the characteristics of the individual diode. For purposes of clarity, the bias supply and the biasing leads to diode 23 have been omitted from the drawing.

In operation, electromagnetic wave energy having a frequency spectrum extending over a given range is propagated through waveguide 20. Preferably, this energy is propagated in the dominant $TE_{10}$ wave mode, since for this mode, the currents induced in the broad walls of the waveguide have substantial components perpendicular to the long dimension of slot 22. In this manner, a variable electric field, the magnitude of which is proportional to the magnitude of the propagating wave energy, is set up across diode 23. Due to the negative resistance characteristic of the diode, this energy is amplified and coupled back into guide 20.

Cavity 26 serves a triple function—first, it matches the impedance of slot 22 and diode 23 to the characteristic impedance of waveguide 20; secondly, it determines to some extent the center frequency of the band of amplification of the device; and, thirdly, cavity 26 prevents radiation and the loss of energy which would normally occur when a slot or iris exists in a waveguide wall.

In practice, slot 22 need not be rectangular but can assume other configurations well known in the art. Slot 22, however, is advantageously proportioned so that it is resonant at some frequency higher than the highest frequency to be amplified. In the case of the rectangular slots shown in the illustrative embodiments of the invention, the length (i.e., the longer dimension) of each slot is preferably about one-half wavelength at this highest frequency. Generally speaking, the height, or shorter dimension, of each slot is proportioned so that it is just large enough to accommodate the diode. In practice, this dimension is of the order of a few hundredths of a wavelength, depending upon the frequency of operation. The loading provided by diode 23 and cavity 26 serves to bring the resonant frequency of the combination down to the desired frequency to be amplified.

As mentioned hereinabove, the embodiment of FIG. 2 allows the coupling between slot 22 and guide 20 to be easily adjusted, thereby varying the degree of amplification. This is seen by noting that the longitudinal components of the currents in the wide walls of guide 20, produced by energy propagating in the dominant $TE_{10}$ wave mode, vary sinusoidally from edge to edge with the maximum currents being in the center. With a movable wafer assembly, such as shown in FIG. 2, slot 22 can be positioned at any point across the guide, from a point of maximum current to a point of substantially zero current.

When the wafer-diode-cavity assembly is positioned so that slot 22 is near one of the narrow walls of guide 20, the coupling is minimum. In this position the device amplifies incident wave energy in the manner previously described. By physically sliding the wafer assembly transversely toward the center of guide 20, the coupling is increased. In this manner the effective load resistance presented to the wafer assembly can be made more nearly equal to the magnitude of the negative resistance of the diode, thus substantially increasing the gain of the device. By sliding the wafer assembly still farther toward the center of guide 20, a point will ultimately be reached where the resistance presented to the wafer is equal to the magnitude of the negative resistance of the wafer-diode-cavity assembly, and oscillation will occur. The invention can thus be adjusted to operate as an oscillator.

Figure 3:
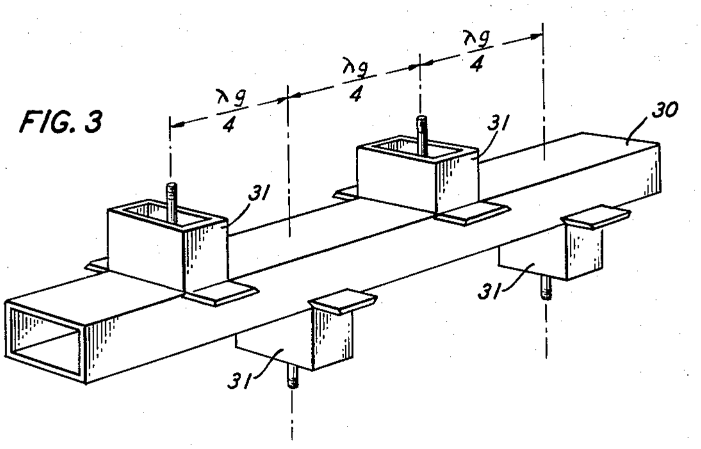
FIG. 3 is a perspective view of another embodiment of the present invention utilizing a plurality of diodes mounted in longitudinally spaced slots in the top and bottom walls of a rectangular waveguide.

In practice, a plurality of such amplifiers can be longitudinally spaced along the walls of a rectangular waveguide as illustrated in FIG. 3. This figure shows, in a perspective view, a section of rectangular waveguide 30. Spaced alternately along the top and bottom wide walls of guide 30 are four slot-diode-cavity structures 31 identical to that shown in FIG. 2. Although four amplifier stages are shown, it is obvious that this is merely for purposes of illustration and that a greater or lesser number of such stages can be utilized.

The longitudinal spacing between centers of successive slots is substantially equal to one-quarter guide wavelength at the midband of the range of frequencies to be amplified. Of course, the spacing can be made equal to an odd multiple of one-quarter wavelength, but it is generally advantageous to keep the distance as short as possible.

In addition, it should again be pointed out that the slot-diode-cavity structures can be spaced solely along either the top or bottom walls of the guide rather than alternately along both walls as shown in FIG. 3. The alternate spacing is generally more convenient, however, in permitting closer spacing of the amplifier assemblies.

For purposes of clarity, the leads by which the individual diodes are supplied with biasing power have not been shown. A single biasing source can be utilized together with appropriate adjusting means for adjusting the bias voltage of each diode separately in order to compensate for the slightly different characteristics of the individual diodes.

In operation, microwave energy, preferably in the $TE_{10}$ wave mode, is propagated through guide 30 where it is amplified by each of the successive amplifier stages 31. The amplified energy that is coupled back into guide 30 from each of the slots propagates both in the same direction as the incident wave and in the direction opposite thereto. The amplified wave energy that propagates down guide 30 in the incident direction adds in phase at each successive amplifier stage so that the magnitude of the signal wave at the end of the guide is a function of the amplification factor or gain of each of the stages, multiplied by the number of such stages. The amplified wave energy that is coupled back into guide 30 to propagate in the opposite direction, however, adds out of phase and tends to cancel.

The canceling effect is somewhat analogous to the cancellation of wave energy in a shorted quarter-wave section of transmission line, except that in the case of the illustrative embodiment of FIG. 3, the cancellation occurs, not once, but at each successive amplifier stage.

Considered in its simplest form, it is advantageous to visualize a wave front propagating in guide 30. At a given instant this wave front is assumed to have advanced in the forward direction to one of the slot-diode amplifier stages. In the next instant, the wave is amplified and coupled back into guide 30 to propagate in the forward and backward directions. The forward propagating wave front reaches the next amplifier stage one-fourth period later when the same process takes place. The forward wave front of this amplified wave propagates as before, still in phase with the forward propagating wave front. The backward propagating energy propagates back down the guide to the first mentioned amplifier stage, which it reaches in another one-fourth period. By this time, however, a new wave has been amplified by the first stage. But since a time equal to one-half the period of the wave energy has elasped, the new wave is 180 degrees out of phase with the returning wave front of the first wave. The backward propagating wave fronts are thereby substantially cancelled.

It is apparent that since the gain of each of the amplifier stages 31 are independently adjustable, a high degree of cancellation of the reflected wave energy can be realized. It is also apparent that the center frequency of adjacent pairs of stages can be adjusted to increase the over-all bandwidth in the manner of a stagger-tuned broadband amplifier.

The foregoing explanation is not completely descriptive of the operation of the embodiment of FIG. 3, primarily due to the fact that the energy of the propagating wave is increased at each successive stage. A complete description of its operation would require analysis on the basis of a distributed parameter circuit rather than on the basis of a succession of lumped parameter circuits. The foregoing explanation, however, is sufficient to illustrate the fact that the forward gain of the over-all amplifier is quite high but very little wave energy is reflected. The small amount of wave energy that is reflected, if it is objectionable, may easily be absorbed or eliminated by an appropriate isolator structure or other device well known in the art.

It is apparent that the above-described arrangements are illustrative of but a small number of the many possible specific embodiments which can represent applications of the principles of the present invention. Numerous and varied other arrangments can readily be devised in accordance with these principles by those skilled in the art without departing from the spirit and scope of the invention.

What is claimed is:

1. In combination, a hollow conductively bounded rectangular waveguiding structure capable of supporting electromagnetic wave energy over a given band of frequencies, a section of one of the broad walls of said waveguiding structure being adjustable in a direction transverse to the longitudinal axis of said structure, a slot in said section electromagnetically coupled to said waveguiding structure, a nonlinear impedance element having a voltage-current characteristic which includes a region of negative dynamic resistance mounted in said slot, a conductive enclosure mounted on said section external to said waveguiding structure and forming a cavity with said section, said enclosure being contiguous to and electromagnetically coupled to said slot, the combination of said slot, nonlinear impedance element and cavity being resonant at a frequency within said band of frequencies, and means for biasing said nonlinear impedance element.

2. The combination according to claim 1 wherein said nonlinear impedance element is a tunnel diode.

3. In combination, a hollow conductively bounded waveguiding structure of rectangular cross section capable of supporting electromagnetic wave energy over a given band of frequencies, a plurality of longitudinally spaced sections in at least one of the broad walls of said waveguiding structure, said sections being adapted for independent movement in a direction transverse to the longitudinal axis of said waveguiding structure, a slot in each of said sections electromagnetically coupled to said waveguiding structure, the longitudinal distance between successive slots being substantially equal to an odd multiple of one-quarter wavelength at the mid-frequency of said band of frequencies, a nonlinear impedance element having a voltage-current characteristic which includes a region of negative dynamic resistance mounted in each of said slots, a conductive enclosure mounted on each of said sections external to said waveguiding structure and forming a cavity with each of said sections, said enclosures being contiguous to and electromagnetically coupled to each of said slots, the combination of each slot, nonlinear impedance element and cavity being resonant at frequencies within said band of frequencies, and means for biasing said nonlinear impedance elements.

4. The combination according to claim 3 wherein said nonlinear impedance elements are tunnel diodes.

No references cited.

ROY LAKE, *Primary Examiner.*

D. R. HOSTETTER, *Assistant Examiner.*